(12) United States Patent
Kawamura (10) Patent No.: US 6,558,853 B1
(45) Date of Patent: May 6, 2003

(54) METHOD FOR MANUFACTURING EXPOSURE MASK, EXPOSURE APPARATUS AND SEMICONDUCTOR DEVICE

(75) Inventor: Daisuke Kawamura, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 104 days.

(21) Appl. No.: 09/661,553

(22) Filed: Sep. 14, 2000

(30) Foreign Application Priority Data

Sep. 17, 1999 (JP) .......................................... 11-263665

(51) Int. Cl.[7] ................................................. G03F 9/00
(52) U.S. Cl. ............................................................ 430/5
(58) Field of Search ................................. 430/5, 22, 30

(56) References Cited

U.S. PATENT DOCUMENTS 5,723,234 A * 3/1998 Yokoyama et al. ............. 430/5
5,935,738 A * 8/1999 Yasuzato et al. ............... 430/5
6,001,512 A * 12/1999 Tzu et al. ........................ 430/5

FOREIGN PATENT DOCUMENTS

JP          8-234410          9/1996

* cited by examiner

Primary Examiner—John A. McPherson
Assistant Examiner—Saleha R. Mohamedulla
(74) Attorney, Agent, or Firm—Finnegan, Henderson, Farabow, Garrett & Dunner, L.L.P.

(57) ABSTRACT

An exposure mask is used for transcribing a desired pattern on a resist on a wafer in a photolithography step. This exposure mask is formed by the arrangement of transcribed pattern film formed in a desired pattern on the transparent substrate. In order to decrease background light, a dummy pattern film formed in a dummy pattern is arranged on the transparent substrate together with the transcribed pattern film. The dummy pattern is designed in such a manner that the dummy pattern is not transcribed on the resist under the exposure condition required for transcribing the desired pattern on the resist in a desired size. Besides, the dummy pattern film is arranged from the transcribed pattern film in a predetermined distance so that the intensity distribution of light which passes through the transcribed pattern film.

8 Claims, 5 Drawing Sheets

METHOD FOR MANUFACTURING EXPOSURE MASK, EXPOSURE APPARATUS AND SEMICONDUCTOR DEVICE

CROSS-REFERENCE TO RELATED APPLICATIONS

This application is based upon and claims the benefit of priority from the prior Japanese Patent Application No. 11-263665, filed Sep. 17, 1999, the entire contents of which are incorporated herein by reference.

BACKGROUND OF THE INVENTION

The present invention relates to a photolithography technology for manufacturing a semiconductor device, and more particularly to a method for manufacturing an exposure mask in which a pattern arrangement on the mask is designed, and an exposure apparatus using the mask, and furthermore a method for manufacturing a semiconductor device.

In recent years, in the field of the manufacture of semiconductors, an exposure apparatus is widely used for transcribing, in a reduced manner on a resist on a wafer, an LSI pattern formed on a reticules (an exposure mask) in order to form a fine pattern on the wafer.

When an optical system is ideal in this kind of exposure apparatus, the same optical contrast, the resist pattern and the exposure margin can be obtained in the repeated patterns with several µm or more. However, actually, there arises a phenomenon in that the resist pattern and the exposure margin differ depending upon the mask open ratio of the used reticule. Specifically, in the case where the positive type resist is used, the exposure margin is narrowed both exposure latitude and Depth of Focus (DOF) with an increase in the mask open ratio of the reticule with the result that a decrease in the resist pattern becomes drastic. This phenomenon is conspicuous particularly in a fine pattern in the vicinity of the resolution limit.

Furthermore, in the case where the mask open ratio is locally different even on the same reticule as well, for example, a line and space (L/S) pattern formed of Cr on the circumference of tens of µm and the resist pattern profile on the wafer corresponding to the L/S pattern all formed of glass on the circumference of tens of µm differ from each other. It is considered that these phenomena results from the fact that the stray light which is not generated in an ideal exposure apparatus is irradiated as a background light on the wafer depending on the mask open ratio, so that the optical contrast is lowered.

In the case where the mask open ratio of the reticules differs, it is sometimes difficult to apply the same resist process in the same object pattern because of the above phenomenon. A huge amount of labor and cost is required to construct a resist process depending on the mask open ratio of the reticule of each layer in order to solve this problem. Furthermore, in the case of system on chip (SOC), that consists of memory portion and logic portion, there arises a case in which an exposure margin/resist pattern profile of a small-scale cell for a cache in the logic portion having a high mask open ratio, a large-scale cell of a memory portion having a low mask open ratio largely differs in some cases.

In this manner, in the exposure apparatus for photolithography which can be currently used, the light intensity contrast of the transcribed pattern is lowered because of the presence of the background light rather than an ideal value calculated from the illumination condition. As a consequence, there is a problem that the exposure margin is narrowed, and the resist profile is poored. Furthermore, the reduction of the light intensity contrast becomes conspicuous with an increase in the mask open ratio.

BRIEF SUMMARY OF THE INVENTION

An object of the present invention is to provide an exposure mask which lowers the intensity of the background light and which can suppress the lowering of the light intensity contrast of the transcribed pattern, an exposure apparatus, and a method for manufacturing a semiconductor device.

The exposure mask can be used to transcribe a desired pattern on a resist on a wafer in the photolithography step. This exposure mask is formed by the arrangement of the transcribed pattern film formed on a desired pattern on a transparent substrate. In the present invention, the intensity of the background light is decreased. In order to suppress the lowering of the light intensity contrast of a desired pattern, a dummy pattern film formed in a dummy pattern is arranged on a transparent substrate together with the transcribed pattern film. The dummy pattern is designed in such a manner that the dummy pattern is not transcribed under an exposure condition which is required for transcribing the desired pattern on a resist in a desired size. Besides, the dummy pattern film is arranged from the transcribed pattern film in a predetermined distance in such a manner that the intensity distribution of light which passes through the transcribed pattern film is not deformed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
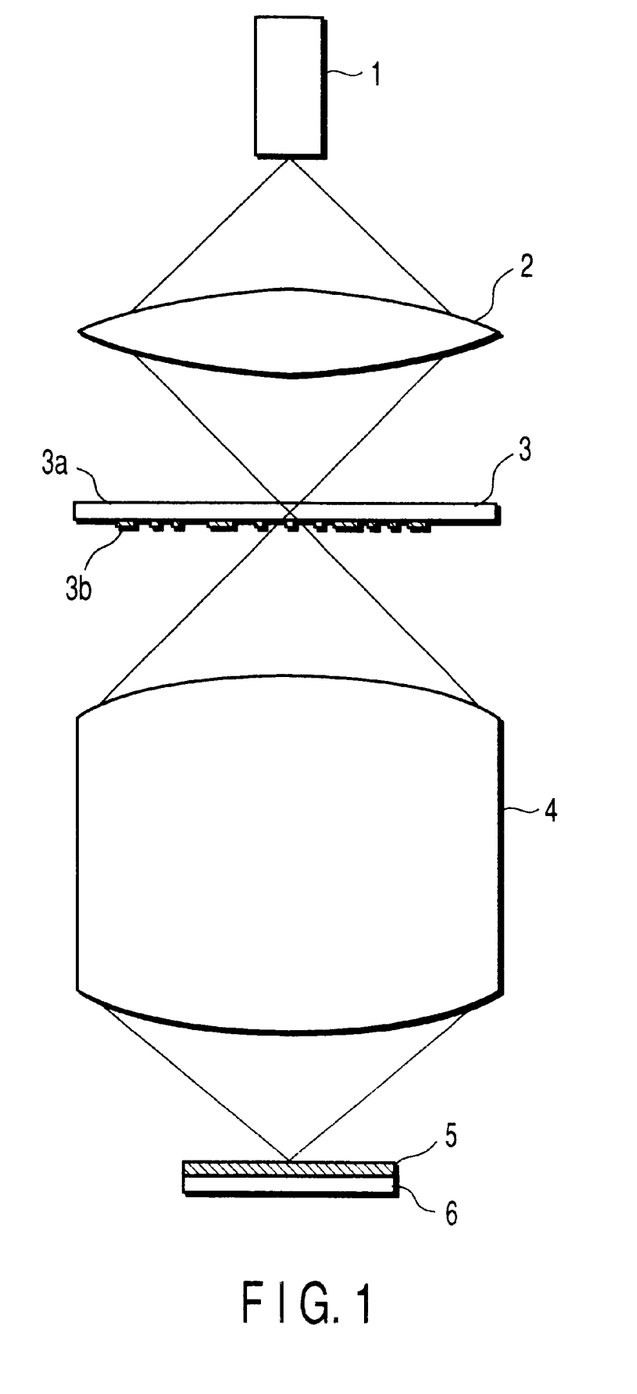
FIG. 1 is a view showing a general structure of an exposure apparatus used in the first embodiment according to the present invention.

FIG. 1 is a structural view showing an exposure apparatus according to the first embodiment of the present invention. In FIG. 1, reference numeral 1 denotes a light source of a KrF excimer laser or the like. Reference numeral 2 denotes a light collection lens. Reference numeral 3 denotes an exposure mask on which an opaque film pattern 3b such as Cr or the like in the mask, molybdenum silicide or like in the attenuated phase shift mask is formed on one main surface of a transparent substrate 3a formed of glass or the like. Reference numeral 4 denotes a reduction projection optical system. Reference numeral 6 denotes a wafer. Reference numeral 5 denotes a resist applied on the wafer 6. With respect to each kind of condition in this exposure apparatus, suppose that the numerical aperture NA is 0.6, an illumination coherent factor σ is 0.75 and light shielding ratio ε is 0.67. Incidentally, the basic structure is the same as the conventional apparatus. However, as will be described later, the exposure mask is different from the conventional one.

Figure 2A:
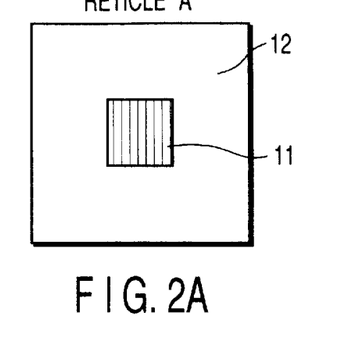
FIG. 2A is a view showing a conventional reticule having a high mask open ratio.
Figure 2B:
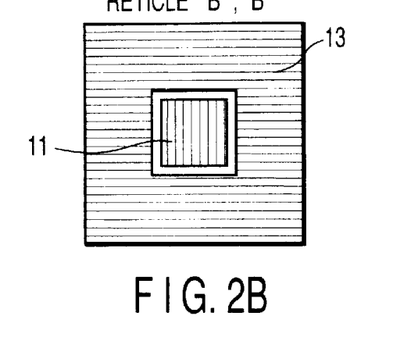
FIG. 2B is a view showing a reticule having a low mask open ratio, wherein a dummy pattern film is arranged in an open portion in the first embodiment.

In order to clarify a difference from the conventional one, as shown in FIGS. 2A and 2B, there are prepared a reticule A formed by arranging on the substrate only the transcribed pattern film 11 formed in L/S pattern (transcribed pattern) which should be transcribed on the wafer, and a reticule B on which a dummy pattern film 13 formed in a dummy pattern is arranged together with the pattern film 11 on the substrate.

The transcribed pattern film 11 of the reticule A is such that a line having a width of 150 nm a wafer scale is formed in L/S pattern arranged with a space of 150 nm on wafer scale and most of them has an open portion 12 (with a mask open ratio of 80%). The reticule B is such that the dummy pattern film 13 is arranged on the open portion 12 in a distance of 1 μm from the L/S pattern film 11. Furthermore, the dummy pattern film 13 is such that a line having a width of 100 nm on wafer scale is arranged in a space of 140 nm on wafer scale. The reticule B is such that the mask open ratio is 60% with the dummy pattern film 13.

Here, the exposure condition is supposed in the following manner. As a resist on the wafer, a positive type chemical amplification type resist is adopted. The exposure Dose is set to a condition of transcribing the pattern of the pattern film 11 of 150 nm on the resist at a ratio of L(line):S(space)=1:1 by using the reticule most of which constitutes the open portion 12. In a similar manner, the reticule B is exposed at an exposure Dose at which the L/S pattern 11 of 150 nm on wafer scale in the reticule B is exposed in a size of L:S=1:1 by using the same illumination system and the same resist process as the reticule A.

Figure 3A:
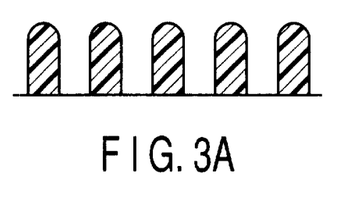
FIG. 3A is a view showing a resist pattern obtained in the reticule of FIG. 2A.
Figure 3B:
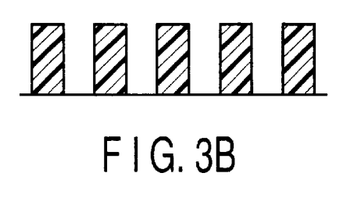
FIG. 3B is a view showing a resist pattern obtained in the reticule of FIG. 2B.

FIG. 3A shows a resist pattern formed by using the reticule A. FIG. 3B shows a resist pattern formed by using the reticule B. While the head of the resist pattern by the reticule A is round as shown in FIG. 3A, a favorable rectangular pattern can be obtained in the reticule B as shown in FIG. 3B. Furthermore, the exposure latitude at 0.4 μm DOF is 7% in the reticule A whereas the exposure latitude at 0.4 μm DOF has been improved by 10% in the reticule B.

Although exposure has been conducted by changing both the exposure Dose, and focus, but the resist at the portion at which the dummy pattern in the reticule B is projected is all resolved and is not transcribed onto the wafer.

Figure 10A:
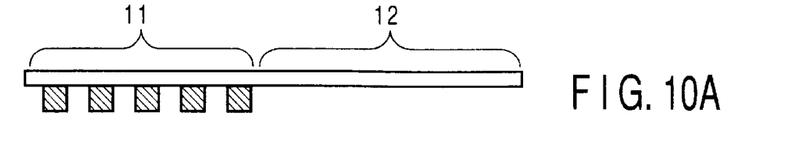
FIG. 10A is a sectional view of a conventional reticule.
Figures 10B, 11A:
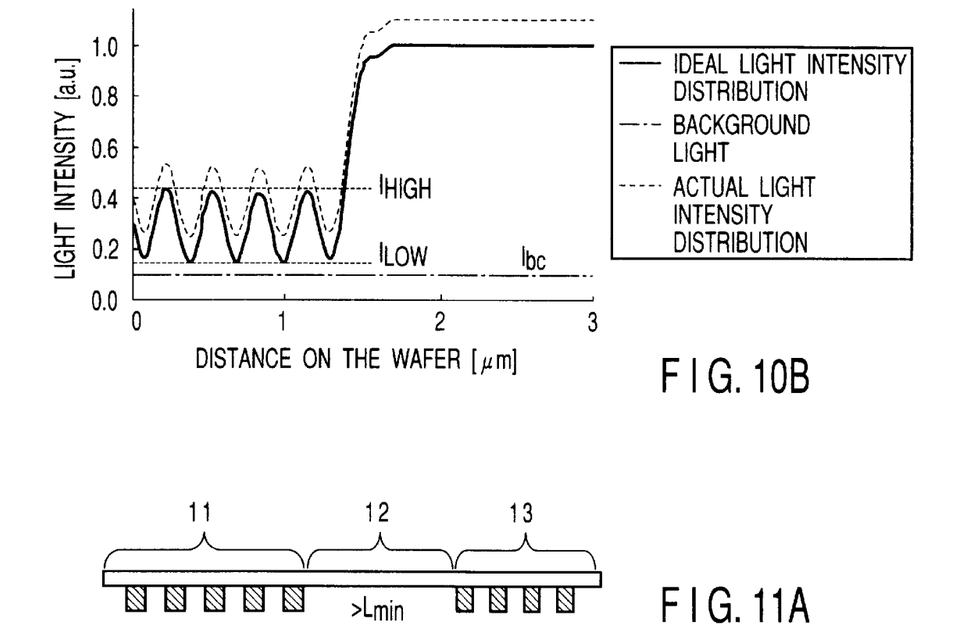
FIG. 10B is a view showing the fact that the light intensity contrast of the transcribed pattern is lowered under the presence of the background light.
FIG. 11A is a sectional view showing a reticule of the present invention.

Here, the operation and the advantage of the embodiment will be explained further in detail. As can be seen in this embodiment, an example is given in which a positive type resist is used. The light intensity distribution of 150 mm L/S pattern on wafer scale in the case of using an ideal exposure apparatus with respect to the reticule A shown in FIG. 10A will be as shown in FIG. 10B. The light intensity contrast in this case can be defined as $$2 \cdot (I_{high} - I_{low})/(I_{high} + I_{low})$$

by using the maximum value Ihigh and the minimum value Ilow within the range of the pattern of the light intensity distribution of the transcribed pattern 11.

However, since the background light Ibc is actually present, which corresponds to the mask open ratio of the reticule, the light intensity contrast corresponding to the intensity distribution of light (shown by a broken line in the drawing) projected on the resist through the transcribed pattern film 11 which is actually obtained is as follows:

$$2 \cdot (I_{high} - I_{low})/(I_{high} + I_{low} + 2I_{bc})$$

The light intensity contrast is lowered as compared with the case of an ideal exposure apparatus.

The exposure margin is narrowed because of the lowering in the light intensity contrast by the background light Ibc so that the pattern profile is deteriorated such as rounding of the head portion of the pattern or the like.

Figure 11B:
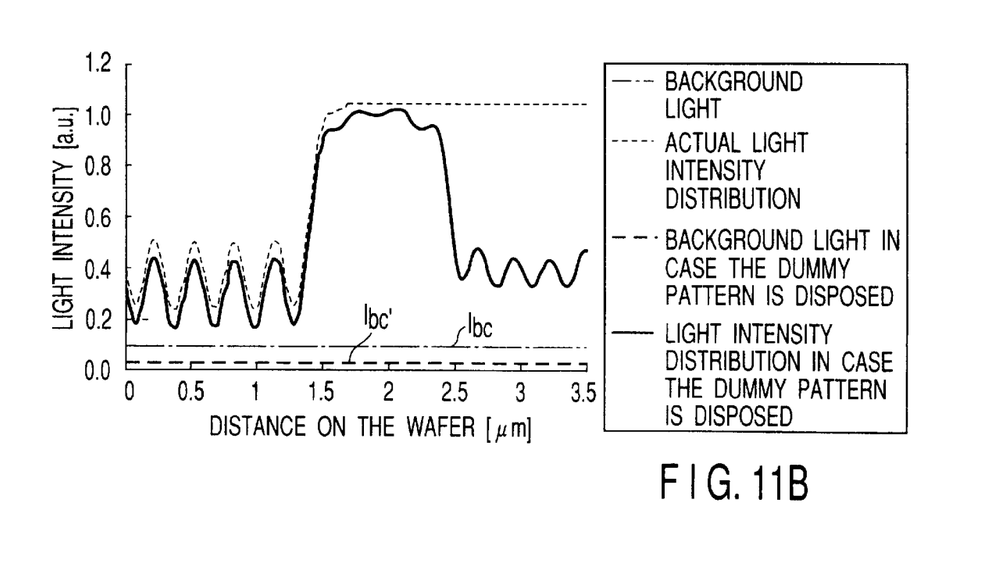
FIG. 11B is a view showing the fact that the lowering of the light intensity contrast of the transcribed pattern is suppressed because of a decrease in the background light according to the present invention.

On the other hand, as shown in FIG. 11A, the mask open ratio of the reticule is lowered when the reticule B is used wherein a dummy pattern film 13 is used together with the pattern film 11. As a consequence, as shown in FIG. 11B, the background light is lowered (Ibc→Ibc'). Consequently, in the case where the profile of the head portion of the resist is round at the time of using the positive type resist (FIG. 3A), the lowering of the light intensity contrast of the transcribed pattern film 11, namely the narrowing of the exposure margin can be suppressed by arranging the dummy pattern film 13 on the reticule open portion 12, so that a favorable resist profile (FIG. 3B) can be obtained.

Besides, it is possible to avoid a case in which the light intensity distribution of the transcribed pattern film 11 is deformed because of the presence of the dummy pattern film 13 by separating at least a distance Lmin at which no optical proximity effect (OPE) can be displayed. Furthermore, it is possible to design the pattern of the transcribed pattern film 11 all by itself without considering the OPE by the dummy pattern film 13.

Also in the case where the dummy pattern film 13 is arranged in the open portion 12 on the reticule, the resist pattern is not transcribed onto the wafer by the dummy pattern 13 with the result that an addition process for removing the dummy pattern portion on the wafer is not required.

Incidentally, in the case where a negative type resist is used instead of the positive type resist, the observation that the head portion profile of the resist is rounded can be replaced with the observation that the profile becomes a T-top or an inversely tapered profile.

Second Embodiment

Figure 4A:
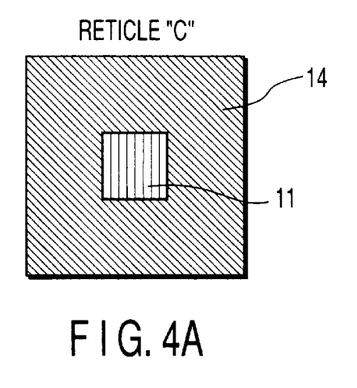
FIG. 4A is a view showing a conventional reticule having a low mask open ratio.
Figure 4B:
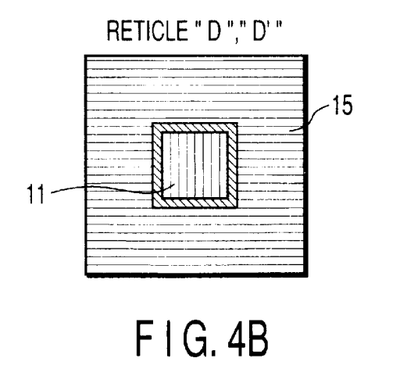
FIG. 4B is a view showing a reticule having a high mask open ratio wherein a dummy pattern is arranged in an open portion in the second embodiment.

In the beginning, as shown in FIGS. 4A and 4B, there is prepared a reticule C on which only an L/S pattern film 11 is formed which is to be transcribed on the resist on the wafer, and a reticule D on which a dummy pattern film 15 is formed together with the L/S pattern film 11. The transcribed pattern film 11 of the reticule C is formed into an L/S pattern of 150 nm/150 nm on wafer scale, so that most thereof constitutes an opaque portion 14 (having a mask open ratio of 20%). The dummy pattern film 15 of the reticule D is provided on the opaque portion 14 of the reticule C in a distance of about 1 µm to be formed into an L/S pattern of 100 nm/90 nm on wafer scale. The mask open ratio of the reticule D is expanded to 35% owing to the dummy pattern film 15.

By using the exposure apparatus on the same conditions to the first embodiment, the reticule C most of which constitutes the opaque portion 14 is exposed at the exposure Dose (and Focus) at which the L/S pattern 11 of 150 nm on wafer scale in the reticule C is exposed in a size of L:S=1:1. Furthermore, the reticule D is exposed at the exposure Dose at which the L/S pattern of 150 nm on wafer scale in the reticule D is exposed in a size of L:S=1:1 by using the illumination system and the resist process which are the same with the reticule C.

Figure 5A:
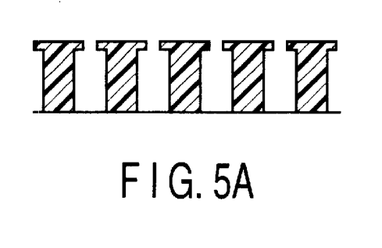
FIG. 5A is a view showing a resist pattern obtained in the reticule of FIG. 4A.
Figure 5B:
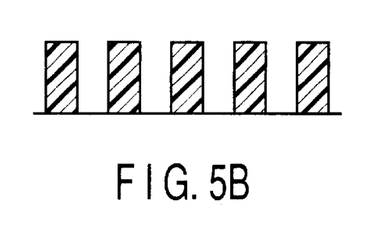
FIG. 5B is a view showing a resist pattern obtained in the reticule of FIG. 4B.

FIG. 5A shows a resist pattern formed on the L/S pattern film 11 of the reticule C. FIG. 5B shows a resist pattern formed by the L/S pattern film 11 of the reticule D. The resist pattern by the reticule C is a T-top or an inversely tapered profile such that a stain remains at the upper portion thereof as shown in FIG. 5A. On the other hand, a favorable rectangular configuration can be obtained as shown in FIG. 5B in the reticule D. Furthermore, the exposure latitude at which 0.4 µm DOF is given in the reticule C is 11% whereas the exposure latitude is 10.5% in the reticule D, so that vertically no change can be observed with respect to the exposure latitude.

Consequently, the second embodiment provides the same advantage as the first embodiment. In other words, in the case where the head portion of the resist assumes a T-top or an inversely tapered profile at the time of using the positive type resist, the background light is increased by arranging the dummy pattern 15 on the opaque portion 14 of the reticule thereby making it possible to provide a resist pattern having a resist pattern with a favorable rectangular configuration.

Here, it is originally desired that no background light is present in this exposure apparatus. However, the exposure apparatus uses a plurality of kinds of the reticules, and some reticule has a large background light, so that the optical condition of the exposure apparatus and the resist composition is allowed to meet with an average reticule and the exposure apparatus is set so as to allow a certain degree of the background light. Consequently, such exposure apparatus is originally the most favorable. When a reticule with extremely small background light as shown in FIG. 3B is used, a T-top or an inversely tapered profile is obtained depending on the setting of the exposure apparatus. In order to prevent this, the dummy pattern film 15 as shown in FIG. 4B is provided in the second embodiment.

Furthermore, in the second embodiment, in a similar manner as the first embodiment, a case can be avoided in which the intensity distribution of light which oases through the transcribed pattern film 11 is deformed with the presence of the dummy pattern film 15 by providing a distance of Lmin or more which does not affect the OPE between the dummy pattern film 15 and the transcribed pattern film 11. Furthermore, the pattern design of the transcribed pattern film 11 can be made by itself by ignoring the dummy pattern film 15.

Also, in the case where a dummy pattern 15 is arranged in the opaque portion 14 of the reticule, the resist pattern is not transcribed on the wafer by the dummy pattern film 15 with the result that an addition process is not required for removing the dummy pattern portion on the wafer.

Incidentally, in the case where a negative type resist is used in place of the positive type resist, the observation that the head portion profile of the resist has T-top or inversely tapered profile can be replaced with the observation that the head portion profile is rounded.

Third Embodiment

In the exposure apparatus on the same condition to the first embodiment, a positive type chemical amplification resist is used to expose the reticule A whose mask open ratio is set to 80% over the whole surface thereof and retcile B whose mask open ratio is set to 60% by adding a dummy pattern film 13 to the open portion 12 on the reticule A.

In a pattern included in the reticule A, the pattern which has the narrowest exposure margin experimentally is the L/S pattern 11 having a width of 150 nm on wafer scale, and the exposure latitude at which 0.4 µm DOF can be obtained is 7%, and the head portion has a round resist profile (FIG. 3A) at this time.

Figure 6A:
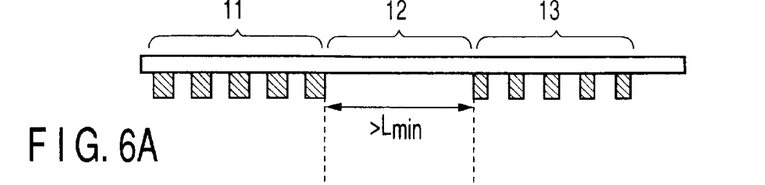
FIG. 6A is a sectional view of a reticule in the third embodiment.
Figure 6B:
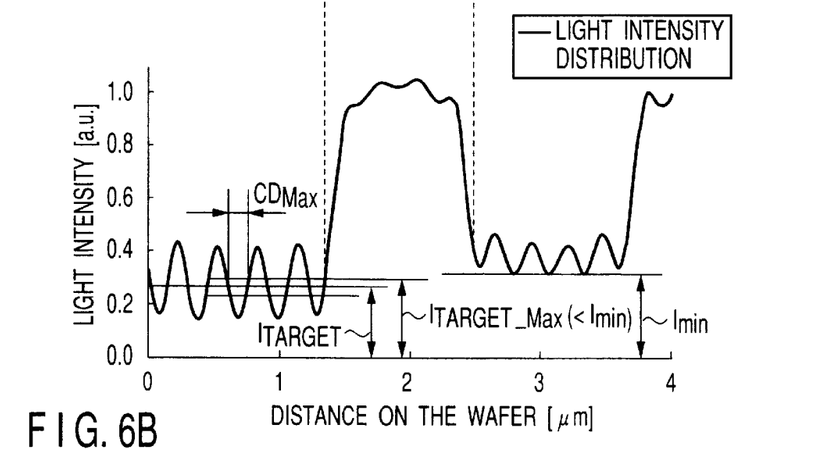
FIG. 6B is a view for explaining a condition under which the dummy pattern on the open portion of the reticule is not transcribed on the resist on the wafer in the third embodiment.

Under the exposure condition, calculations have been conducted on NA, σ, ε, the presence or absence of resolution enhancement technology, an ideal light intensity distribution regulated with lens aberration with respect to the L/S pattern 11 of 150 nm on wafer scale. FIGS. 6A and 6B respectively show the light intensity distribution with respect to the distance on the wafer in the case where the reticule B is used. When the intensity of light projected on the resist through the dummy pattern film 13 becomes higher than the intensity of light projected on the resist through the transcribed pattern film 11, the dummy pattern is all resolved. The minimum value Imin of the light intensity in the dummy pattern film 13 becomes larger than the light intensity Itarget at which the transcribed pattern film 11 is resolved as designed. Consequently, it can be considered that the dummy pattern film 13 is substantially the same with the open portion at Itarget.

In the third embodiment, the light intensity which provides 165 nm which is the upper limit of the tolerated size of 150±15 nm is set to Itarget max in the calculation of the light intensity at the time of 0 μm and 0.3 μm defocus of the L/S pattern film 11 of 150 nm on wafer scale as the transcribed pattern, the L/S pattern (a pattern pitch Pdummy=260 nm on wafer scale) having the line width of 100 nm/space width of 160 nm on wafer scale is selected wherein the minimum value Imin of the light intensity in the region of the dummy pattern 13 satisfies a mathematical expression of Itarget-max<Imin.

The vertical axis of the calculation of the light intensity distribution is an arbitrary value. In the case of the positive type resist, the resist pattern in the region of more than a certain light intensity (hereinafter referred to as a threshold value) corresponds to the resolved region. In other words, the increase in the threshold value becomes an increase in a line size resulting from a decrease in the exposure Dose whereas a decrease in the threshold value becomes an increase in the line size resulting from an increase in the exposure Dose. Even when the exposure Dose is changed, the light intensity ratio of the transcribed pattern film 11 and the dummy pattern film 13 is not changed, so that the dummy pattern portion on the wafer is all resolved if the minimum value Imin of the light intensity projected on the resist is larger than the maximum value Itarget-max of the threshold value within the allowed size of the pattern projected on the resist through the dummy pattern film 13. As a consequence, only the transcribed pattern can be formed on the wafer. Besides, the relationship of the light intensity between the transcribed pattern film 11 and the dummy pattern film 13 can be changed with the defocus, so that the calculation is conducted at the defocus quantity of 0 μm and at 0.3 μm which is the maximum value on one side of the required DOF.

By the calculation of the light intensity distribution, the distance at which the desired size change quantity by the presence of the dummy pattern film 13 becomes 1% or less is set to the distance Lmin which does not affect the light intensity distribution of the transcribed pattern film 11 wherein the presence of the dummy pattern film 13 is present in the reticle. Under the optical conditions described in the third ii embodiment, the distance is set to Lmin=950 nm. As a distance exceeding that distance, Lmin=1000 nm is adopted in the case where the dummy pattern film 13 is arranged in the reticle B. When this distance is represented in infinite dimension number, the distance corresponds to 2.4λ/NA (>2.3λ/NA).

In the case of the whole region of the reticle data, the open portion 12 of 2Lmin+Pdummy (=2260 nm) or more is retrieved, so that the dummy pattern film 13 is arranged by providing the distance of Lmin (=1000 nm) from the dummy pattern film 13. At the exposure Dose at which 165 nm is provided which is the upper limit of the tolerated size of the line in the L/S pattern of 150 nm on wafer scale, the dummy pattern portion on the wafer is all resolved.

The head portion in the resist profile of the L/S pattern 11 of 150 nm in the reticle A having a mask open ratio of 80% is round (FIG. 3A) and the exposure Dose tolerance at the 0.4 nm DOF is 7%. On the other hand, in the reticle B having a mask open ratio of 60% wherein the dummy pattern 13 is arranged with the method of the third embodiment, a resist profile with a favorable rectangular profile (FIG. 3B) can be obtained, and the exposure latitude is 10% at 0.4 μm DOF. In this manner, the resist profile and the exposure margin have been improved by the third embodiment as described above.

In this manner, according to the third embodiment, when the maximum of the light intensity at which the transcribed pattern film 11 formed in a desired size is set to Itarget-MAX (corresponding to the maximum value of the tolerated size of the line in the positive type resist and a maximum value of the space in the negative type resist), the resist portion to which light is projected through the dummy pattern film 13 is all resolved in the positive type resist but is not all resolved and remain in the negative type resist if the minimum value Imin of the intensity distribution of light which passes through the dummy pattern film 13 satisfies a mathematical expression of Imin>Itarget-MAX with the result that only the resist image of the transcribed pattern film 11 can be formed on the wafer.

Furthermore, when the exposure wavelength is set to λ and the numerical aperture of the projection optical system is set to NA, the light intensity distribution of the transcribed pattern film 11 is not affected even when the dummy pattern film 13 is arranged by providing a distance of 2.3λ/NA or more from the transcribed pattern film 11. Consequently, the arrangement of the dummy pattern film 13 in the distance is the finest thereby making it possible to decrease most of the mask open ratio of the reticle.

Fourth Embodiment

In the place of the L/S pattern having a line width of 100 nm/a space width of 160 nm on wafer scale, there is prepared a reticle B' in which the L/S pattern having a line width of 95 nm/a space width of 135 nm on wafer scale is formed as the dummy pattern film 13. Then, the reticle B' is exposed under the same condition as the previous one. Here, the dummy pattern film 13 has a pattern pitch of 230 nm on wafer scale. In the illumination in the third embodiment, the dummy pattern satisfies a condition under which no image is resolved, namely the condition of λ/NA(1+σ)≧Pdummy In other words, the following mathematical expression is established.

Range[248/{0.6×(1+0.75)} to 236.1]≧95+135=235

By using the reticle B, having a mask open ratio of 58% in which such dummy pattern film 13 is provided, a favorable rectangular profile shown in FIG. 3A is obtained, and the exposure latitude tolerance at 0.4 mm DOF is 10%.

Here, it the case where the pattern pitch (for example, a distance between center lines of the line) by setting to constant the ratio of the space width to the line width where line width<space width is established, the amplitude of the light intensity distribution becomes small with a decrease in the pattern pitch. Besides, the average value of the light intensity distribution does not virtually change, or the average value decreases when the pattern pitch becomes fine in the vicinity of the limit of the resolution. As a consequence, in the case where the ratio of the space width to the line width is constant, the maximum value of the light intensity distribution of a dummy-pattern becomes smaller with a decrease in the pattern pitch. In order words, when the maximum value of the light intensity distribution is not more than the threshold value, the space width becomes smaller with a decrease in the pattern pitch. Consequently, in the case where the dummy patterns are arranged in the same number, the mask open ratio of the reticule further decreases.

However, since it is difficult to form too fine patterns in good precision actually, pattern pitches are actually used at the maximum pitch no more than the resolution limit under the used illumination condition.

Fifth Embodiment

In an exposure apparatus according to the first embodiment, by using a positive type chemical amplification type resist, the reticule C having a mask open ratio of 20% as an average on the whole surface of the reticule and the reticule D whose mask open ratio is set to 30% by adding the dummy pattern 15 to be described later to the opaque portion 14 on the reticule C are exposed.

In the transcribed pattern film 11 included in the reticule C, experimentally the narrowest exposure margin is the L/S pattern of 150 nm on wafer scale, and the exposure latitude at which 0.4 $\mu$m DOF can be obtained is 10%. However, the pattern profile is a T-top or an inversely-tapered profile (FIG. 4).

Figure 7A:
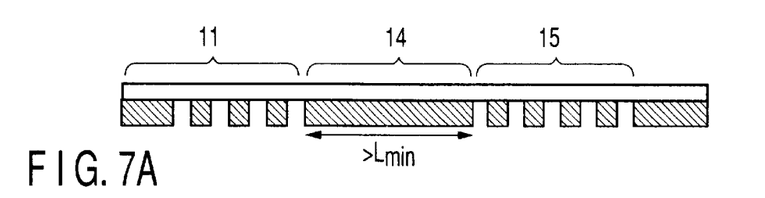
FIG. 7A is a sectional view of the reticule in the fifth embodiment.
Figure 7B:
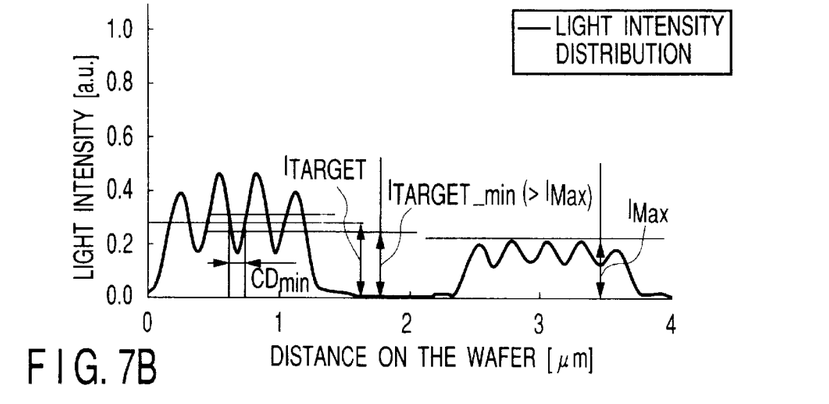
FIG. 7B is a view for explaining a condition under which the dummy pattern in a reticule opaque portion is not transcribed on the resist on the wafer in the fifth embodiment.

Under the exposure condition, an ideal light intensity distribution is calculated, which is regulated by NA, $\sigma$, $\epsilon$, the presence or absence of the resolution enhancement technology, the lens aberration. FIG. 7A shows the reticule D. FIG. 7B shows a distribution of light intensity with respect to the distance on wafer scale in the case where the reticule D is used. The light intensity in the dummy pattern film 15 becomes lower than the light intensity in the transcribed pattern film 11, so that the maximum value Imax of the intensity of light projected on the resist through the dummy pattern 15 becomes smaller than the light intensity Itarget required for resolving the pattern of the transcribed pattern film 11 as designed. Consequently, at Itarget, the dummy pattern film 15 can be substantially regarded as the opaque portion.

In the fifth embodiment, in the calculation of the light intensity at the time of the defocus of 0 $\mu$m and 0.3 nm of the L/S pattern film 11 of 150 nm on wafer scale, when the light intensity required for securing the lower limit (CDmin) 135 nm of the tolerated size of 150±15 nm of the pattern on the resist is set to Itarget min, the L/S pattern (pattern pitch Pdummy) having a line width of 60 nm/a space width of 100 nm on wafer scale is selected in the calculation in which the maximum value Imax of the light intensity in the region of the dummy pattern film 15 satisfies the mathematical expression of Itarget-min>Imax.

The vertical axis of the light intensity distribution calculation is an arbitrary unit. In the case of the positive type resist, the resist pattern in the region of a certain light intensity or more (hereinafter referred to as a threshold value) corresponds to the resolved region. In other words, the increase in the threshold value becomes an increase in the line size resulting from a decrease in the exposure Dose while the decrease in the threshold value becomes an increase in the line size resulting from an increase in the exposure Dose. This means that even when the exposure Dose is changed, the light intensity ratio of the transcribed pattern film 11 and the dummy pattern film 15 is not changed, and when the maximum value Imax of the light intensity of the dummy pattern film 15 is smaller than the minimum value Itarget min of the of the threshold value in the tolerated size of the transcribed pattern film 11, the resist is not resolved and remains on a region corresponding to the dummy pattern 15 on the wafer. Furthermore, the relationship of the light intensity of the transcribed pattern film 11 and the dummy pattern film 15 changes with the defocus, so that the calculation is conducted at the defocus quantity of 0 $\mu$m and the maximum value of the required DOF of 0.3 $\mu$m in the fifth embodiment.

From the light intensity distribution calculation, the distance at which the variation quantity of the desired size becomes 1% or less by the presence of the dummy pattern film 15 is set to the distance Lmin which does not affect the light intensity distribution of the transcribed pattern film 11 in which the presence of the dummy pattern film 15 is found in the reticule. In the optical description described in the fifth embodiment, the distance is set to Lmin=950 nm. In the case where the dummy pattern film 15 is arranged in the reticule D as a distance exceeding that, the distance of Lmin=1000 nm has been adopted. When the distance is represented in the infinite dimension number, the distance corresponds to 2.4$\lambda$/NA (>2.3$\lambda$/NA).

In the case of the whole region of the reticule data, the opaque portion 14 of 2Lmin+Pdummy (=2260 nm) or more is retrieved, so that the dummy pattern film 15 is arranged in the distance of Lmin (=1000 nm) or more from the transcribed pattern film 11. At the exposure Dose at which 135 nm is provided which is the lower limit of the tolerated size of ±10% in the L/S pattern film 11 of 150 nm on wafer scale, the dummy pattern portion on the wafer holds the same residual film as the unexposed portion.

FIGS. 5A and 5B shows the resist configuration of the L/S pattern 11 of 150 nm obtained by the exposure of the reticules C and D. The resist pattern by the reticule C has a T-top or an inversely tapered profile (FIG. 5A) whereas a favorable rectangular pattern can be obtained with the reticule D. Furthermore, the exposure latitude at which 0.4 $\mu$m DOF is given is 11% with the reticule C, and the exposure latitude is 10.5% with the reticule D and the exposure latitude does not virtually change.

Here, in FIGS. 7A and 7B, when the light intensity at which the transcribed pattern film 11 is formed in a desired size is Itarget min (which corresponds to the minimum value of the tolerated size of the line in the positive type resist, and the minimum value of the space in the negative resist). The maximum value Imax of the light intensity distribution of the dummy pattern film 15 satisfies a mathematical expression of Imax<Itarget min, the resist image projected on the resist via the dummy pattern 15 is not all resolved and retains in the positive type resist while the image is all resolved in the negative type resist, so that only the resist film projected on the resist via the transcribed pattern 11 on the wafer is formed.

Here, when the exposure wavelength is set to $\lambda$, and the numerical aperture of the projection optical system is set to NA, the light close contact effect can be ignored by arranging the dummy pattern film 15 in a distance of 2.3$\lambda$/NA or more from the transcribed pattern film 11, so that the light intensity distribution of the transcribed pattern film 11 is not deformed. Consequently, the arrangement of the dummy pattern film in the above distance is the finest in the arrangement of a specific dummy pattern, thereby making it possible to decrease most the mask open ratio of the reticule.

Sixth Embodiment

There is prepared a reticule D' provided with a dummy pattern film 15 formed in the L/S pattern having a line width of 135 nm/a space width of 95 nm on wafer scale in the place of the L/S pattern having a line width of 160 nm/a space width of 100 nm on wafer scale in fifth embodiment. Then the reticule D' is exposed under the same condition as described above. Here, the line width of 135 nm/the space width of 95 nm satisfies the following condition under which no dummy pattern is resolved on the resist in the illumination according to the third embodiment.

$$\lambda/NA(1+\sigma) \geq P\text{dummy}.$$

In other words, Range[248/{0.6×(1+0.75)} to 236.1 nm]≧135+95=230 is established.

In this manner, a favorable rectangular pattern profile (FIG. 5B) can be obtained by using the reticule D' having a mask open ratio of 32% and having a dummy pattern film 15 provided thereon with the result that the exposure latitude is 10.5% at 0.4 µm DOF and the exposure latitude does not virtually change.

Here, in the case where the pattern pitch is changed by setting constant the line width/space width which is a ratio of the line width and the space width, the amplitude of the light intensity distribution becomes small with a decrease in the pattern pitch. Besides, the average value of the light intensity distribution does not virtually change even when the pattern pitch becomes small. Otherwise, when the pattern pitch becomes fine in the vicinity of the resolution limit, the average value increases. As a consequence, in the case where the ratio of the line width and the space width is constant, the minimum value of the light intensity distribution of the pattern becomes larger with a decrease in the pattern pitch. In other words, in order that the maximum value of the light intensity distribution is equal to or less than a certain threshold value, since the ratio of the space width increases with a decrease in the pattern pitch with the result that the mask open ratio of the reticule can be increased by arranging the same number of dummy patterns.

Seventh Embodiment

Figures 8A, 8B, 8C:
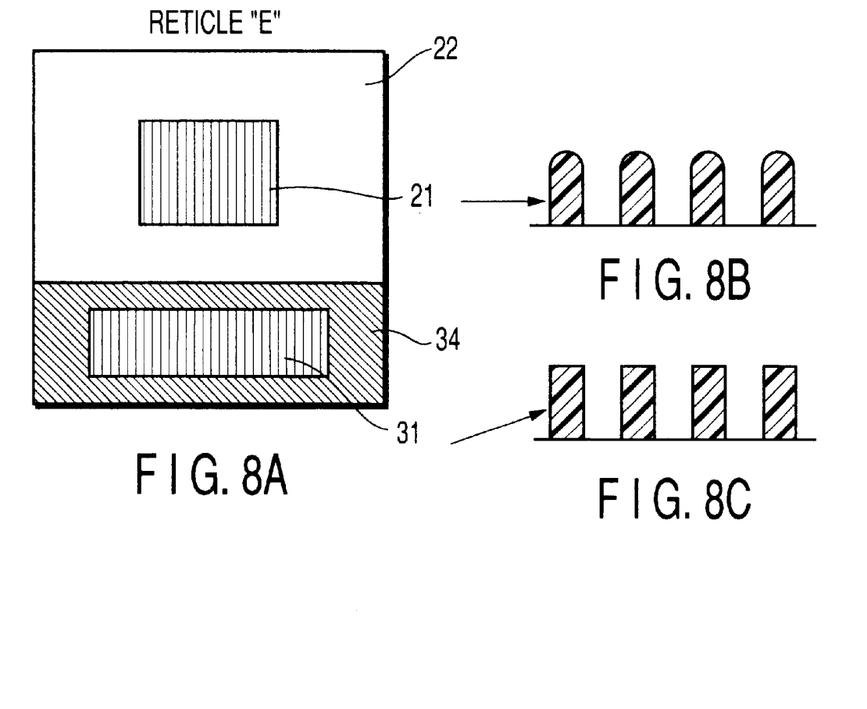
FIG. 8A is a plan view of a conventional reticule.
FIG. 8B is a view showing a resist pattern obtained from the pattern film in the open portion of FIG. 8A.
FIG. 8C is a view showing a resist pattern in the opaque portion of FIG. 8A.

There is prepared a reticule E which has an average mask open ratio of 80% at the upper portion 2/3 and an average mask open ratio of 30% at the lower portion 1/3 as shown in FIG. 8A by using an exposure apparatus of the first embodiment. A positive type chemical amplification type resist is used to exposure. Reference numerals 21 and 31 denote transcribed pattern film, reference numeral 22 denotes an open portion, and reference numeral 34 denotes an opaque portion. In the L/S pattern films 21 and 31 of 160 nm included both in the upper portion and the lower portion of the reticule, a resist pattern has a head portion which is around as shown in FIG. 8A at the upper portion thereof while a favorable rectangular pattern as shown in FIG. 8C can be obtained in the lower portion thereof. The exposure latitude at 0.4 µm DOF is 9% at the upper portion of the reticule whereas the exposure latitude is 13% at the lower portion of the reticule.

Figure 9A:
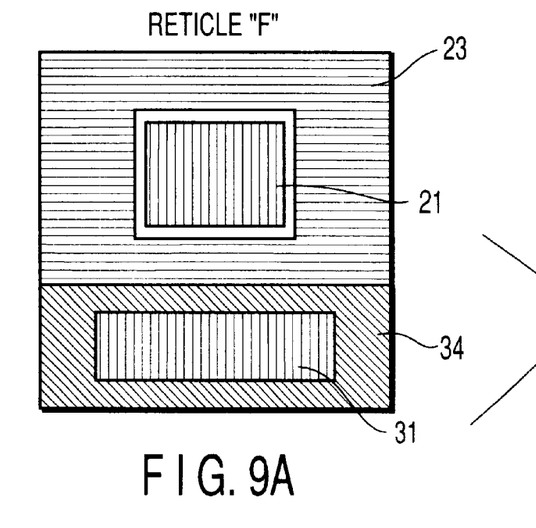
FIG. 9A is a plan view of a reticule of the seventh embodiment.
Figure 9B:
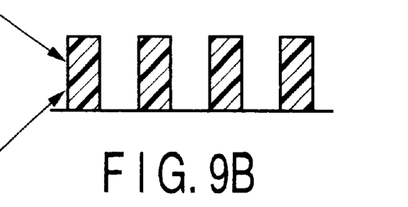
FIG. 9B is a view showing a resist pattern obtained with a pattern film surrounded by the dummy pattern of FIG. 9A.

On the other hand, by using a similar method as seen in the third embodiment, as shown in FIG. 9A, there is prepare a reticule F having an average mask open ratio which is set to 60% at the upper portion 2/3 by adding a dummy pattern film 23 having a line width of 95 nm/a space width of 135 nm on wafer scale to the Iregion of the reticule upper portion 2/3 in the calculation on the wafer, so that the exposure is conducted under the same condition. In such a case, the resist profile and the exposure latitude of the reticule upper portion 23 is the same as the reticule E. In the reticule lower portion 1/3, a favorable rectangular profile can be obtained which is similar to the reticule upper portion 2/3, so that the exposure latitude of 12.5% can be obtained at 0.4 µm DOF.

Incidentally, in an example of FIG. 9A, the dummy pattern 23 is formed at an open portion 2. In addition, a dummy pattern may be formed at an opaque portion 34.

In this manner, in the case where a local difference of the mask open ratio in a certain reticule is large, an exposure margin and a difference in the resist profile is generated with a local coverage on the circumference of the pattern in a pattern which can be regarded as the same pattern except that Cr line width such as line pattern, an island pattern is different. As a consequence, in the case where a difference in the reticule mask open ratio is extremely large, there arises a case in which a common exposure margin within the shot cannot be taken. In this case, it becomes possible to suppress the exposure margin, and a difference in the resist profile without making the overall change of the pattern design by reducing the difference in the whole mask open ratio by the formation of the dummy pattern as can be seen in the seventh embodiment.

Eighth Embodiment

There are prepared the reticule A having an average mask open ratio of 80% and the reticule C having an average mask open ratio of 30% by using an exposure apparatus of the first embodiment. Then, a positive type chemical amplification type resist is used as the resist to exposure. As the transcribed pattern film 11 included in the reticules A and C, the head portion has a round resist profiles (FIG. 3A) in the reticule A having a mask open ratio of 80% in the L/S pattern of 160 nm whereas a favorable rectangular profile (FIG. 3B) can be obtained in the reticule C having a mask open ratio of 30%. The exposure latitude at 0.4 µm DOF is 9% in the reticule A having a mask open ratio of 80% and the exposure latitude is 13% in the reticule C having a mask open ratio of 30%.

Here, in the eighth embodiment, by using the same method as the third embodiment, the reticule B is manufactured which has an average mask open ratio of 45% by arranging the dummy pattern film 13 having a line width of 95 nm/space width of 135 nm on wafer scale in the open portion 12 of the reticule A having a mask open ration of 30%. Then, when this reticule B is exposed under the condition, a favorable rectangular pattern (FIG. 3A) which is similar to the reticule C having a mask open ratio of 80% can be obtained, so that the exposure latitude of 12.35% can be obtained at 0.4 µm DOF.

In this manner, in the case where a large difference is generated in the mask open ratio of the reticules among a plurality of reticules, a large difference is generated in an exposure margin and a resist profile with the mask open ratio even in the pattern which can be regarded as the same pattern except that Cr line width such as line patterns and island patterns is different. In the case where the mask open ratio of the reticule is high, namely, in the case where the deterioration of the exposure margin and the resist profile is conspicuous, it becomes necessary to change the resist process such as the change of the phenomenon and the resist itself. In such a case, it becomes possible to decrease the labor required for the adjustment of the resist process for each of the reticules by providing an embodiment.

Incidentally, the present invention is not restricted to each of the embodiments. In the eighth embodiment, both the transcribed pattern and the dummy pattern are both formed into an L/S pattern, but any of these patterns are not restricted to the L/S pattern. The advantage of the present invention appears more conspicuously in patterns having cycles. However, the advantage of the present invention can be sufficiently obtained in patterns having no cycles, so that the transcribed pattern and the dummy pattern may not necessarily have cycles.

Besides, it has been described that the transcribed pattern refers to a pattern which is actually transcribed and formed on the wafer while the dummy pattern refers to a pattern which is formed on the mask but is not transcribed and formed on the wafer. However, actual transcribed patterns include patterns (circuit patterns) which contribute to the function of the LSI circuit (semiconductor devices) in the case of the transcription on the wafer, and patterns (CMP patterns, matching mark or the like) which do not contribute to the function of these LSI circuit. In patterns which do not contribute to the function of these LSI circuit, there are many cases in which precise size control is not required. In other words, the restriction on the position relationship with the dummy pattern which restriction is required for the transcribed pattern described in the eighth embodiment may only be established with respect to the pattern (circuit pattern) which contributes to the function of the LSI circuit. With respect to the patterns (CMP patterns and matching patterns) which do not contribute to the function of the LSI circuit, it is not required that the position relationship with the dummy pattern which restriction is required for the transcribed pattern needs not be established.

Furthermore, the present invention has a feature in the pattern arrangement of the mask for exposure, and the structure of the optical system of the exposure apparatus is not restricted to FIG. 1.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure mask for transcribing a desired pattern on a resist on a wafer comprising:

a transparent substrate;

a transcribed pattern film arranged on the transparent substrate, the transcribed pattern film being formed in a desired pattern; and a dummy pattern film arranged on the transparent substrate, the dummy pattern film being arranged from the transcribed pattern film in a predetermined distance, the dummy pattern film being formed in a dummy pattern, the dummy pattern being not transcribed on the resist under an exposure condition required for transcribing the desired pattern to the resist in a desired size, the dummy pattern film being arranged on an opaque portion of the exposure mask in a distance of at least $2.3\lambda/NA$ on wafer scale from the transcribed pattern film, symbol $\lambda$ denotes a wavelength of exposure light and NA denotes a numerical aperture of a projection optical system.

2. The exposure mask according to claim 1, wherein the dummy pattern is designed under the condition of satisfying Imax<Itarget over the whole region of the required exposure margin, where symbol Imax denotes a maximum value of the intensity of light projected on the resist through the dummy pattern film, and Itarget denotes the intensity of light on the resist which is required for transcribing the transcribed pattern on the resist in a desired size.

3. The exposure mask according to claim 2, wherein the dummy pattern has a plurality of lines arranged in a space, and the line width and the space width are designed to satisfy the condition.

4. The exposure mask according to claim 3, wherein the dummy pattern is designed under a condition of satisfying $Pdummy \leq \lambda/(NA(1+\sigma))$ so that no image is formed where Pdummy denotes a pitch of the line on wafer scale, symbol $\lambda$ denotes a wavelength of an exposure light used to transcribe the desired pattern on the resist, NA denotes a numerical aperture ratio of lens, and symbol $\sigma$ denotes an illumination coherent factor.

5. An exposure mask for transcribing a desired pattern on a resist on a wafer comprising:

a transparent substrate;

a transcribed pattern film arranged on the transparent substrate, the transcribed pattern film being formed in a desired pattern; and a dummy pattern film arranged on the transparent substrate, the dummy pattern film being arranged from the transcribed pattern film in a predetermined distance, the dummy pattern film being formed in a dummy pattern, the dummy pattern being not transcribed on the resist under an exposure condition required for transcribing the desired pattern to the resist in a desired size, the dummy pattern film being arranged on an open and opaque portion of an exposure mask in a distance of at least $2.3\lambda/NA$ on wafer scale from the transcribed pattern film, symbol $\lambda$ denotes a wavelength of exposure light and NA denotes a numerical aperture of a projection optical system.

6. The exposure mask according to claim 5, wherein the dummy pattern is designed under the condition of satisfying Imax<Itarget, and Imax<Itarget over the whole region of the required exposure margin, where symbol Imax denotes a maximum value of the intensity of light projected on the resist through the dummy pattern film, and Itarget denotes the intensity of light on the resist which is required for transcribing the transcribed pattern on the resist in a desired size.

7. The exposure mask according to claim 6, wherein the dummy pattern has a plurality of lines arranged in a space, the line width and the space width are designed to satisfy the condition.

8. The exposure mask according to claim 7, wherein the dummy pattern is designed under a condition of satisfying $Pdummy \leq \lambda/(NA(1+\sigma))$ so that no image is formed wherein Pdummy denotes a pitch of the line on wafer scale, symbol $\lambda$ denotes a wavelength of exposure light, NA denotes a numerical aperture ratio of lens, and symbol $\sigma$ denotes an illumination coherence factor.

* * * * *